(12) United States Patent
De Lange

(10) Patent No.: US 7,145,810 B1
(45) Date of Patent: Dec. 5, 2006

(54) HIGH DENSITY MEMORY AND MULTIPLEXER CONTROL CIRCUIT FOR USE THEREIN

(75) Inventor: Willem De Lange, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/069,674

(22) Filed: Feb. 28, 2005

(51) Int. Cl.
*G11C 7/10* (2006.01)

(52) U.S. Cl. ............ 365/189.02; 365/190; 365/230.02; 365/230.06

(58) Field of Classification Search ........... 365/189.02, 365/190, 230.02, 230.03, 230.06
See application file for complete search history.

(56) References Cited

U.S. PATENT DOCUMENTS 6,137,730 A * 10/2000 Chien .................... 365/189.02
6,363,023 B1 * 3/2002 Andersen et al. ........... 365/207

* cited by examiner

*Primary Examiner*—Gene N. Auduong
(74) *Attorney, Agent, or Firm*—Hickman Palermo Truong & Becker LLP

(57) ABSTRACT

A high density memory is disclosed wherein multiple memory cells are placed in a single cell region. To accommodate the multiple memory cells, multiple bit lines are provided. Also provided is a multiplexer circuit that is coupled to the multiple bit lines. When the memory cells in a region are activated by a common word line, they put their stored data bits onto the multiple bit lines. The multiplexer circuit then selects one of the bit lines, and provides the data bit on that bit line to a latch. In one implementation, the multiplexer circuit comprises a plurality of bit line circuits, and each bit line circuit comprises a precharge circuit, a precharge control circuit, a data sensing circuit, and a sensing control circuit. These components of the bit line circuits help to ensure that the memory operates effectively and without data corruption.

23 Claims, 4 Drawing Sheets

HIGH DENSITY MEMORY AND MULTIPLEXER CONTROL CIRCUIT FOR USE THEREIN

BACKGROUND

In a typical memory, memory cells are arranged in rows and columns, as shown in FIG. 1. Each memory cell 104 resides within a cell region 102, and each memory cell 104 has a control input coupled to a word line 106, and a data terminal coupled to a bit line 108. All of the memory cells 104 in a row are coupled to the same word line 106, and all of the memory cells 104 in a column are coupled to the same bit line 108.

Also coupled to the bit lines 108 are a precharge circuit 112 and a sensing circuit and latch 114. The precharge circuit 112 precharges each bit line 108 to prepare the bit line for a read operation, and the sensing circuit and latch 114 senses the data on the bit lines 108, and latches/stores it. In effect, the sensing circuit and latch 114 acts as a buffer for the data on the bit lines 108.

In a typical read operation, the memory 100 functions as follows. Initially, the precharge circuit 112 precharges the bit lines 108 to prepare them for the read operation. Then, the decoder 110 receives a read enable signal and a set of address signals on the address lines. In response, the decoder 110 decodes the address, and activates one of the word lines 106 (the precharge circuit 112 stops precharging the bit lines 108 prior to the activation of the word line 106). As a result of the word line 106 being activated, each of the memory cells 104 coupled to that word line 106 outputs its data onto a corresponding bit line 108. Depending upon the data stored therein, each memory cell 104 may leave its corresponding bit line 108 charged, or it may discharge the bit line 108. The sensing circuit and latch 114 senses the charge on each bit line 108 and determines therefrom the data on each bit line 108. The latch 114 then latches and stores that data. At some point, towards the end of the word line being activated, the sensing circuit and latch 114 completes its latching operation and the sensing circuit 114 is turned off. After that happens, the precharge circuit 112 is turned on again to precharge the bit lines 108. In this manner, a read cycle is completed.

In the memory 100 of FIG. 1, there are X bit lines 108 (hence, the memory 100 is able to read out X bits at a time) and Y word lines 106. With this number of bit lines 108 and word lines 106, the memory 100 can accommodate an X times Y number of memory cells 104. In the memory industry, there is a constant push to increase the density of memories. With the size of a cell region 102 limited to a certain size by practical considerations, there is a limit to which the density of the memory 100 in FIG. 1 can be increased. To increase the memory density beyond this limit, a different memory architecture needs to be used.

SUMMARY

In accordance with one embodiment of the present invention, there is provided a memory architecture that enables greater memory density to be achieved. There is also provided a multiplexer control circuit for use in such a memory architecture.

In one embodiment, greater memory density is achieved by putting a plurality of memory cells (instead of one, as shown in FIG. 1) in a single cell region. To accommodate multiple memory cells in a cell region, multiple bit lines are provided. Also provided is a multiplexer circuit that is coupled to the multiple bit lines. Each memory cell in a cell region has a control input coupled to a common word line, and a data terminal coupled to one of the plurality of bit lines. In one embodiment, each memory cell in a cell region is coupled to a different one of the plurality of bit lines.

When the common word line is activated, for example, during a read operation, each of the memory cells in the cell region puts its stored data bit onto its corresponding bit line. Not all of the data bits on all of the bit lines are sensed and latched, however. Instead, the multiplexer circuit coupled to the plurality of bit lines selects, based upon one or more select signals, one of the plurality of bit lines, and provides the data bit on that bit line to a latch. Thus, only one of the memory cells in a cell region is read at a time. By putting multiple memory cells in a cell region in this way, and by using the multiplexer circuit to select one of the memory cells at a time, each row of memory cells in effect acts as multiple rows of memory cells. In practical terms, what this means is that, to implement the same number of memory cells as the memory 100 of FIG. 1, significantly fewer rows are needed. For example, if two memory cells are placed in each cell region, a memory in accordance with this embodiment of the present invention would have half as many rows as the memory 100 of FIG. 1. This reduction in rows enables the same memory capacity to be realized using significantly less space, which, in turn, significantly increases the memory density. In one embodiment, this increase in density is realized without having to significantly enlarge the size of a cell region.

In one embodiment, the multiplexer circuit comprises a plurality of bit line circuits. Each bit line circuit is coupled to receive a corresponding bit line and one or more select signals. Based at least partially upon the select signals, the bit line circuit selectively provides the data on the corresponding bit line to the output of the multiplexer circuit. The bit line circuits in the multiplexer circuit operate in such a manner that data from only one of the bit lines is provided to the output of the multiplexer circuit at any given time.

In one embodiment, each bit line circuit comprises components for performing a variety of functions. These components include a precharge circuit for precharging a corresponding bit line, a precharge control circuit for controlling the precharge circuit, a data sensing circuit for sensing data on a corresponding bit line and providing the data on that bit line to the output of the multiplexer circuit, and a sensing control circuit for controlling the data sensing circuit. The precharge control circuit generates a precharge control signal and the sensing control circuit generates a sensing control signal. In one embodiment, the precharge control signal is timed such that it causes the precharge circuit to stop precharging the corresponding bit line before any word line is activated. Further, the sensing control signal is timed relative to the precharge control signal such that the sensing control signal causes the data sensing circuit to stop sensing data on the corresponding bit line before the precharge control signal causes the precharge circuit to precharge the corresponding bit line. These control signals are timed such that they have ample non-overlap time to ensure proper operation. Overall, the bit line circuit, and hence, the multiplexer circuit ensures that the memory operates optimally and without data corruption.

DETAILED DESCRIPTION OF EMBODIMENT(S)

Memory Overview

Figure 2:
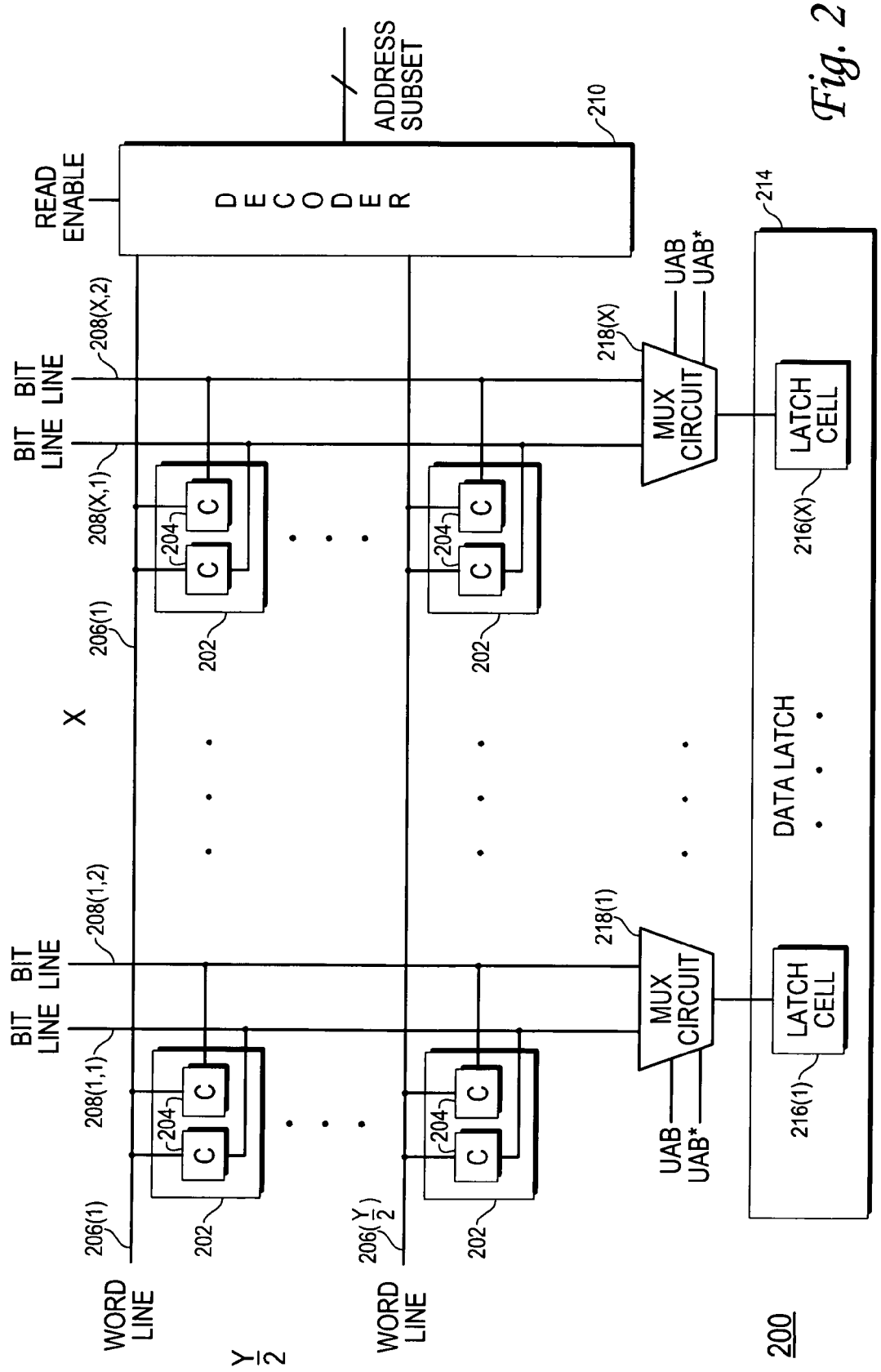
FIG. 2 is a block diagram of a high density memory in accordance with one embodiment of the present invention.

With reference to FIG. 2, there is shown a block diagram of a sample memory 200 in accordance with one embodiment of the present invention. In the sample memory 200, two memory cells 204 are shown in each cell region 202. It should be noted that this is for illustrative purposes only. If so desired, more memory cells 204 may be placed in each cell region 202. Generally, any n number of memory cells 204 may be placed in a single cell region 202, where n is any integer greater than one. The number n, of course, may be limited by practical considerations.

As shown in FIG. 2, the memory 200 comprises a plurality of cell regions 202 arranged in rows and columns. Each cell region 202 comprises two memory cells 204. Each memory cell 204 in a cell region 202 has a control input coupled to a common word line 206. Thus, both memory cells 204 in a cell region 202 are activated by the same word line 206. All of the cell regions 202 in the same row share a common word line 206. Thus, all of the memory cells 204 in all of the cell regions 202 in a row are activated by the same word line 206.

To accommodate the multiple memory cells 204 in each cell region 202, there is provided a plurality of sets of bit lines 208. In one embodiment, there is a set of bit lines 208 for each column of cell regions 202. In the sample memory 200, there are X columns of cell regions 202; thus, there are X sets of bit lines 208. Each set of bit lines 208 comprises a bit line 208 for each memory cell 204 in a cell region 202. Since there are, in the simplest embodiment shown in FIG. 2, two memory cells 204 in each cell region 202, each set of bit lines comprises two bit lines 208.

Each memory cell 204 has a data terminal coupled to a corresponding bit line 208. In one embodiment, each memory cell 204 in a cell region 202 is coupled to a different bit line 208 of a set of bit lines. Coupled in this way, each bit line 208 in a set of bit lines carries data to/from a different corresponding memory cell 204 of a cell region 202. All of the memory cells 204 in all of the cell regions 202 in a column share the same set of bit lines 208. Thus, as shown in FIG. 2, the first memory cell 204 in each cell region 202 in the first column is coupled to bit line 208(1,1), and the second memory cell 204 in each cell region 202 in the first column is coupled to bit line 208(1,2).

Coupled to each set of bit lines 208 is a multiplexer circuit 218. In addition to the bit lines 208, each multiplexer circuit 218 also receives a set of select signals (UAB and UAB*, which will be discussed further in a later section). Based at least partially upon the select signals, a multiplexer circuit 218 selects one of the bit lines 208 in the corresponding set of bit lines, and provides data from that bit line 208 to the output of the multiplexer circuit 218. The data is then provided to a latch cell 216 in a latch 214, where it may be stored. In one embodiment, in addition to performing a multiplexing function, each multiplexer circuit 218 also performs a variety of other control functions. For example, the multiplexer circuits 218 precharge the bit lines 208 and sense the data on the bit lines 208. The multiplexer circuits 218 also generate the proper control signals for controlling the timing of the precharge and sensing functions. These and other functions are performed by the multiplexer circuits 218, and will be described in greater detail in a later section.

Memory 200 further comprises an address decoder 210. The address decoder 210 receives a read enable signal and a set of address signals, and responds by decoding the address signals, and activating one of the word lines 206. In one embodiment, the decoder 210 does not receive all of the address signals. Rather, it receives only a subset thereof. In the sample memory 200 of FIG. 2, the decoder 210 receives all but one bit of the address. The remaining bit, which may be the least significant bit or any other bit of the address, is applied to the multiplexer circuits 218 as one of the select signals. More specifically, the remaining bit, also referred to as the undecoded address bit (UAB), is provided as a select signal to the multiplexer circuits 218. Also provided is the complement UAB* of this bit. Using these select signals UAB, UAB*, the multiplexer circuits 218 can determine which of the bit lines 208 in a set of bit lines to select.

In memory 200, because there are two bit lines 208 in each set of bit lines, only one undecoded address bit is needed (this one bit is sufficient for the multiplexer circuit 218 to select between the two bit lines 208). If more memory cells 204 are placed in each cell region 202, thereby requiring more bit lines 208 in each set of bit lines, then more undecoded address bits would need to be supplied to each multiplexer circuit 218. For example, if each cell region 202 has four memory cells 202 (thereby requiring four bit lines 208), then two undecoded address bits would be needed (i.e. the decoder 210 would receive all but two bits of the address, and the remaining two bits and their complements would be provided to the multiplexer circuits 218 as select signals). These two undecoded address bits would enable the multiplexer circuit 218 to select between the four bit lines 208. Similarly, if each cell region 202 has eight memory cells 202 (thereby requiring eight bit lines 208), then three undecoded address bits would be needed (i.e. the decoder 210 would receive all but three bits of the address, and the remaining three bits and their complements would be provided to the multiplexer circuits 218 as select signals). Thus, in accordance with one embodiment of the present invention, the number of undecoded address bits can be increased to accommodate more memory cells 204 in each cell region 202.

Sample Operation

With reference to FIG. 2, a sample read operation of the memory 200 will now be described. Initially, the multiplexer circuits 218 precharge their corresponding bit lines 208 to prepare them for a read operation. Then, at some point, the decoder 210 receives a read enable signal and a subset of address signals. In response, the decoder 210 decodes the subset of address signals and activates a particular one of the word lines 206 (for the sake of example, it will be assumed that word line 206(1) is activated). In one embodiment, to prevent potential damage to the various devices and to curtail unnecessary power consumption, each multiplexer circuit 218 ensures that it stops precharging the bit lines 208 before the particular word line 206(1) is activated.

In response to the activation of the word line 206(1), each memory cell 204 coupled to the word line 206(1) outputs its stored data onto a corresponding bit line 208. More specifically, each memory cell 204 in each cell region 202 of that row outputs its stored data onto a corresponding bit line 208 of a corresponding set of bit lines. Depending upon the state of the stored data (a logic 1 or a logic 0), a memory cell 204 may leave its corresponding bit line 208 charged, or it may discharge the bit line 208.

The data from the memory cells 204 is received by the multiplexer circuits 218 on the bit lines 208. Based at least partially upon the select signals UAB, UAB*, each multiplexer circuit 218 selects one of the bit lines 208 to which it is coupled. It senses the data on that bit line 208, and provides the sensed data at the output of the multiplexer circuit 218. The sensed data is then provided to a latch cell 216 to be stored therein. In this manner, even though both memory cells 204 of each cell region 202 are read out, the data from only one of the memory cells 204 is actually latched and provided as output data.

At some point, the data is fully latched into the latch cells 216. At that point, the multiplexer circuits 218 stop sensing the data on the selected bit lines 208 and begin precharging the bit lines 208 again. In one embodiment, to prevent data corruption, the multiplexer circuits 218 ensure that data sensing is stopped before the bit lines 208 are precharged again. In this manner, the memory 200 completes a read cycle.

A point to note regarding the above description is that, because there are two memory cells 204 in each cell region 202, each row of memory cells 204 effectively behaves as two rows. When a word line 206 is activated, for example, during a read operation, two rows worth of memory cells 204 are read out. The multiplexer circuits 218 are then used to select one of the bit lines 208, thereby, effectively selecting one of the two "rows". Because each row of memory cells 204 acts as two rows of memory cells, the number of rows needed to implement the memory 200 is significantly reduced. In the memory 200 of FIG. 2, half as many rows (Y/2) are needed as compared to the memory 100 of FIG. 1 to achieve the same memory capacity. By reducing the number of rows of memory cells, the space needed to implement the memory 200 is significantly reduced. This in turn significantly increases the density of the memory 200. In this manner, higher memory density is achieved.

Figure 1:
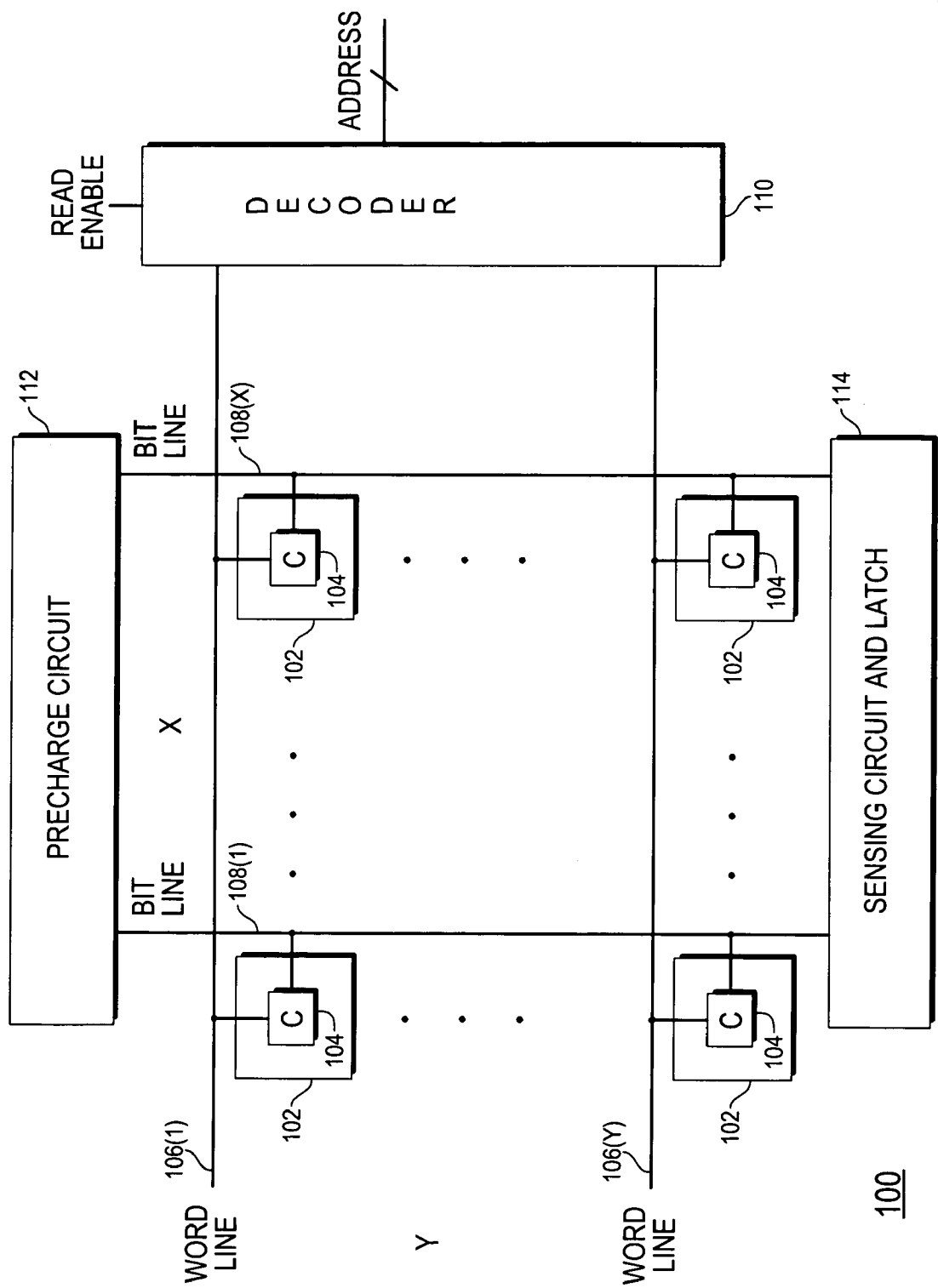
FIG. 1 is a block diagram of a typical memory.

One of the consequences of having fewer rows of memory cells is that the bit lines 208 can be made much shorter (about half the length of the bit lines 108 of the memory 100 of FIG. 1). Shorter bit lines 208 give rise to significant benefits. For example, a shorter bit line 108 requires less charge to precharge it. As a result, the devices (e.g. transistors) used to charge the bit line 208 can be made smaller, which reduces the space needed to implement the memory 200, which adds to the density of the memory 200 and reduces cost. Similarly, a shorter bit line 208 requires less charge to be removed to discharge it. Because of this, the devices in the read stack of each memory cell 204 can be made much smaller. This in turn enables each memory cell 204 to be made much smaller. This is one of the reasons that multiple memory cells 204 can be fitted into a single cell region 202. In one embodiment, the cell region 202 in the memory 200 of FIG. 2 is approximately the same size as the cell region 102 in the memory 100 of FIG. 1 (cell region 202 is just slightly larger than cell region 102). In one embodiment, the cell region 202 is one pitch size, which is approximately 5.2 micrometers in a given technology. Thus, because (at least partially) of shorter bit lines 208, more memory cells 204 can be placed in a cell region 202 without significantly increasing the size of the cell region 202. These and other benefits flow from shorter bit lines and from the overall architecture of the memory 200 of FIG. 2.

Multiplexer Circuit Overview

Figure 3:
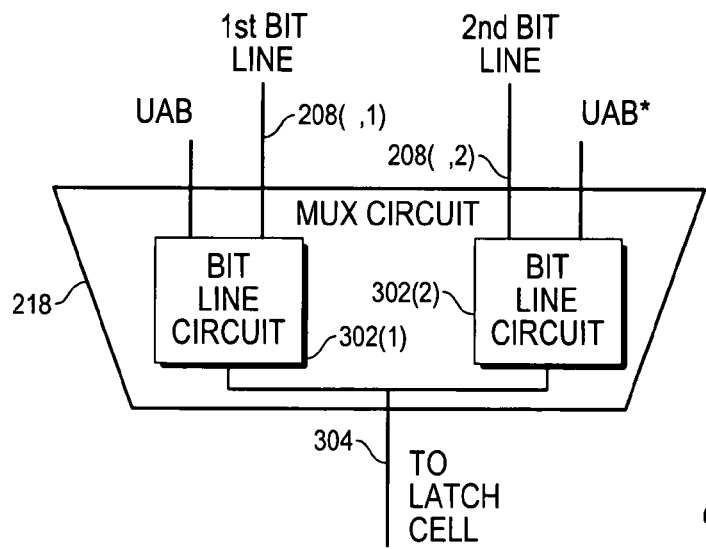
FIG. 3 is a high level block diagram of a multiplexer circuit in accordance with one embodiment of the present invention.
Figure 4:
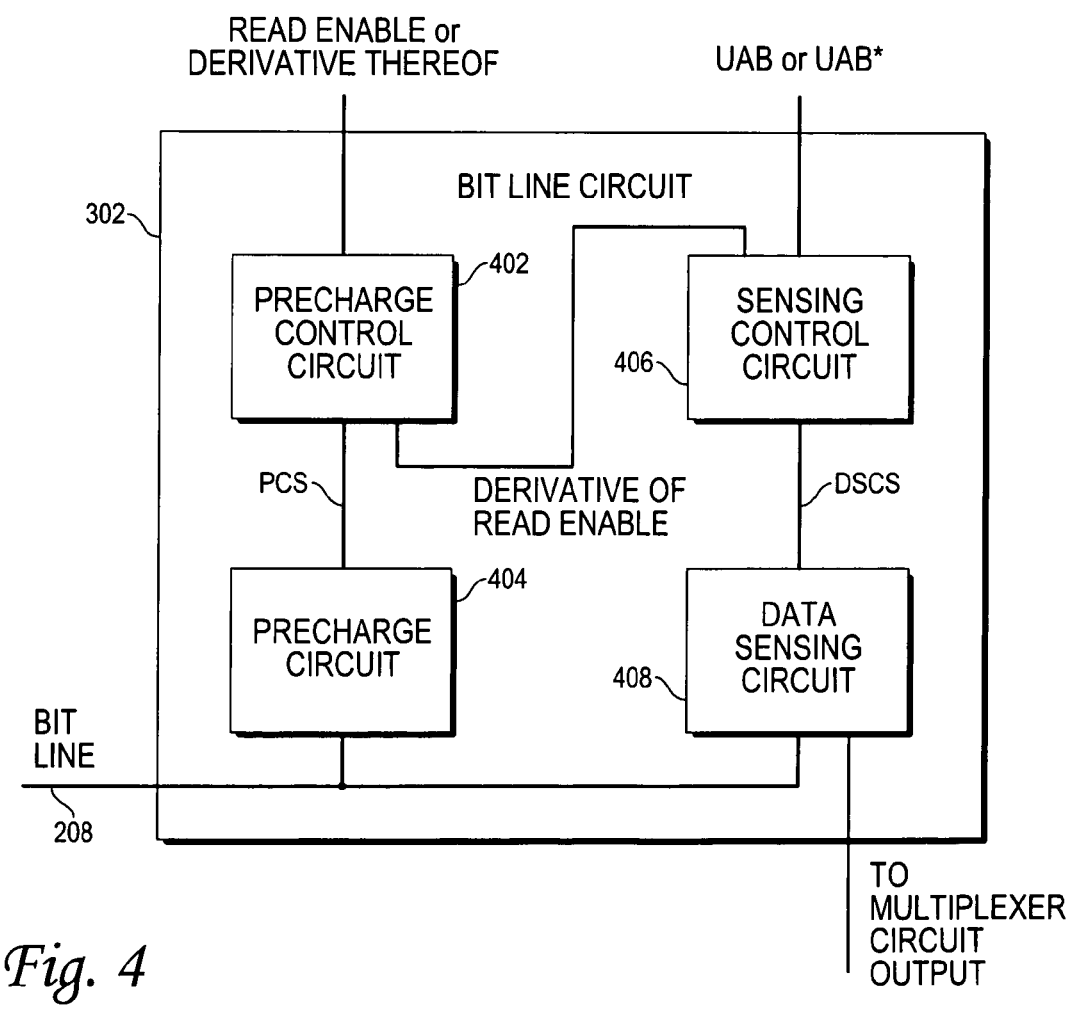
FIG. 4 is a block diagram showing the multiplexer circuit of FIG. 3 in greater detail.
Figure 5:
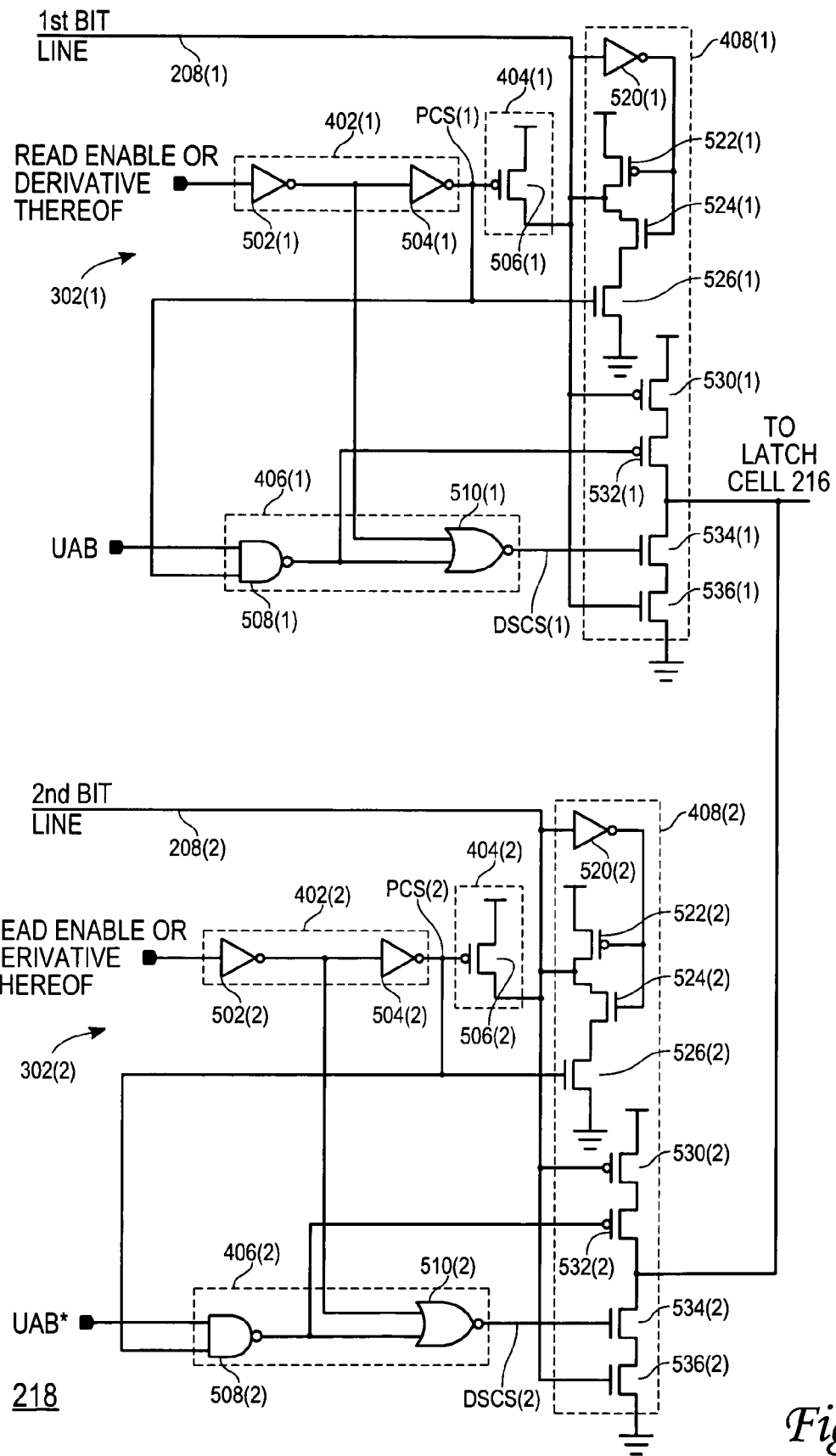
FIG. 5 is a circuit diagram showing one possible implementation of the multiplexer circuit of FIG. 3, in accordance with one embodiment of the present invention.

As noted previously, in addition to performing a multiplexing function, each multiplexer circuit 218 in one embodiment of the present invention also performs a variety of other functions. With reference to FIGS. 3–5, these functions will now be described in greater detail.

FIG. 3 shows one of the multiplexer circuits 218 of FIG. 2 in slightly greater detail. As shown, a multiplexer circuit 218 comprises two bit line circuits 302. The first bit line circuit 302(1) receives the first bit line 208(,1) in a set of bit lines, and the second bit line circuit 302(2) receives the second bit line 208(,2) in a set of bit lines. Also, the first bit line circuit 302(1) receives the UAB as a select signal, and the second bit line circuit 302(2) receives the complement UAB* of UAB as a select signal. Depending at least partially upon the value of the select signals UAB, UAB*, one of the two bit line circuits 302 will be activated during a read. When activated, a bit line circuit 302 senses the data on its corresponding bit line 208, and provides that data to the output 304 of the multiplexer circuit 218. In one embodiment, only one of the two bit line circuits 302 will be sensing data at any given time. Thus, data from only one of the two bit lines 208 will be provided at the multiplexer circuit output 304 at any given time.

FIG. 4 shows in greater detail one of the bit line circuits 302 of FIG. 3. As shown, a bit line circuit 302 comprises a precharge circuit 404 for precharging a bit line 208, a precharge control circuit 402 for controlling the operation of the precharge circuit 404, a data sensing circuit 408 for sensing data on the bit line 208 and providing that data to the multiplexer circuit output 304, and a sensing control circuit 406 for controlling the operation of the data sensing circuit 408.

In one embodiment, the precharge control circuit 402 receives a buffered version of the read enable signal, and generates therefrom a precharge control signal PCS. This control signal PCS is used to activate and deactivate the precharge circuit 404. In one embodiment, the precharge control signal PCS is timed such that it causes the precharge circuit 404 to stop precharging the bit line 208 before any word line 206 is activated. This prevents potential damage to the devices in the precharge circuit 404 and the memory cells 204, and curtails unnecessary power consumption.

In one embodiment, the sensing control circuit 406 receives several control input signals. These include a select signal (either UAB or UAB*) and one or more delayed versions of the read enable signal received from the precharge control circuit 402. Based at least partially upon these input signals, the sensing control circuit 406 generates a data sensing control signal DSCS. This control signal DSCS is used to activate and deactivate the data sensing circuit 408. In one embodiment, the DSCS is timed relative to the PCS such that the DSCS causes the data sensing circuit 408 to stop sensing data on the bit line 208 before the PCS causes the precharge circuit 404 to precharge the bit line 208. This relative timing between the two control signals PCS, DSCS prevents data corruption.

A point to note regarding the above discussion is that both the PCS and DSCS are generated using a read enable signal as the reference signal. This, in part, allows the timing of the control signals to be fine tuned to achieve a large, non-overlap timing safety margin.

Sample Implementation of Multiplexer Circuit

With reference to FIG. 5, there is shown a sample circuit implementation for the multiplexer circuit 218 of FIG. 3. The top portion of FIG. 5 (indicated by reference number 302(1) and an arrow) shows the circuitry for the first bit line circuit 302(1) of FIG. 3, and the bottom portion (indicated by reference number 302(2) and an arrow) shows the circuitry for the second bit line circuit 302(2) of FIG. 3. As can be seen, the two bit line circuits 302 are substantially identical. The differences lie in the lines and signals received by the two circuits. Specifically, the first bit line circuit 302(1) receives the first bit line 208(1) and the UAB select signal, while the second bit line circuit 302(2) receives the second bit line 208(2) and the UAB* select signal.

As shown in FIG. 5, each bit line circuit 302 comprises a precharge circuit 404, a precharge control circuit 402, a data sensing circuit 408, and a sensing control circuit 406 (these components correlate with the corresponding components shown in block form in FIG. 4). In the embodiment shown, the precharge control circuit 402 comprises two inverters: 502 and 504. The first inverter 502 has an input coupled to receive a buffered version of the read enable signal, and an output. The second inverter 504 has an input coupled to the output of the first inverter 502, and an output. The output of the second inverter 504 is used as the precharge control signal PCS. The PCS is fed to the precharge circuit 404 to control the operation thereof. In the embodiment shown, the precharge circuit 404 comprises a PMOS transistor 506 having a gate terminal coupled to receive the PCS, a source terminal coupled to a power supply, and a drain terminal coupled to a bit line 208. In response to a proper PCS, transistor 506 precharges the bit line 208.

The sensing control circuit 406 comprises a NAND gate 508 and a NOR gate 510. The NAND gate 508 has a first input coupled to receive a select signal (either UAB or UAB*), and a second input coupled to receive the output of the second inverter 504, which is a delayed version of the read enable signal. The output of the NAND gate 508 is coupled to an input of the NOR gate 510. The NOR gate 510 also has another input coupled to receive the output of the first inverter 502, which is also a delayed version of the read enable signal (but this signal is a lesser delayed version of the read enable signal than the delayed read enable signal fed to the input of the NAND gate 508). The output of the NOR gate 510 is used as the data sensing control signal DSCS, and this signal is applied to the data sensing circuit 408 to control the operation thereof.

The data sensing circuit 408 comprises two portions. The bottom portion is the portion that actually provides the data on the bit line 208 to a latch cell 216, and the top portion acts as a booster circuit to help accelerate the transition of the data on the corresponding bit line 208. As shown, the top portion comprises an inverter 520, a PMOS transistor 522, and two NMOS transistors 524, 526. The inverter 520 has an input coupled to the bit line 208, and an output. The PMOS transistor 522 has a source terminal coupled to a power supply, a gate terminal coupled to the output of the inverter 520, and a drain terminal. The NMOS transistor 524 has a drain terminal coupled to the drain terminal of transistor 522, a gate terminal coupled to the output of the inverter 520, and a source terminal. Finally, the NMOS transistor 526 has a drain terminal coupled to the source terminal of transistor 524, a gate terminal coupled to the output of inverter 504, and a source terminal coupled to ground. In this configuration, the PMOS transistor 522 acts as a keeper transistor to keep the corresponding bit line 208 precharged even after a precharge signal is no longer applied to the bit line 208. In contrast, the NMOS transistors 524 and 526 act as discharge transistors to help discharge the corresponding bit line 208 more quickly. By doing so, the NMOS transistors 524 and 528 accelerate the discharge of the bit line 208 when such discharge is initiated by a memory cell 204 (FIG. 2).

The bottom portion of the data sensing circuit 408 comprises two PMOS transistors 530, 532 and two NMOS transistors 534, 536. The PMOS transistor 530 has a source terminal coupled to a power supply, a gate terminal coupled to the bit line 208, and a drain terminal. The PMOS transistor 532 has a source terminal coupled to the drain terminal of transistor 530, a gate terminal coupled to the output of NAND gate 508, and a drain terminal. The NMOS transistor 534 comprises a drain terminal coupled to the drain terminal of transistor 532, a gate terminal coupled to the output of NOR gate 510, and a source terminal. Finally, the NMOS transistor 536 has a drain terminal coupled to the source terminal of transistor 534, a gate terminal coupled to the bit line 208, and a source terminal coupled to ground. In the implementation shown, the gates of transistors 530 and 536 act as the data inputs for receiving data from the bit line 208. The drain of transistor 532 and the drain of transistor 534 act as the data output of the data sensing circuit 408. Finally, the gate of transistor 534 acts as the control input of the data sensing circuit 408 to receive the data sensing control signal DSCS from the output of the NOR gate 510.

In one embodiment, the output of the NOR gate 510 transitions from a logic 0 to a logic 1 with a relatively long delay (this means that the data sensing circuit 408 is activated with a relatively long delay, which is desirable). However, the output of the NOR gate 510 transitions from a logic 1 to a logic 0 relatively quickly. This allows the data sensing circuit 408 to be deactivated quickly. This is also desirable because it enables the data sensing circuit 408 to be deactivated well before the precharge circuit 404 precharges the bit line 208, with ample safety margin. Timing the deactivation of the data sensing circuit 408 and the precharging of the bit line 208 in this manner serves to prevent data corruption. In the embodiment shown, due to the principle advantage of the NAND and NOR gate implementation as shown, the timing of the PCS and the DCSC can be fine tuned to achieve a large non-overlap timing safety margin. In some implementations, this margin can be 40%, which is a very attractive safety margin. This large margin allows the technology parameters of the devices used to implement the multiplexer circuit 218 to vary widely without causing operational errors in the circuit. Overall, multiplexer circuit 218 enables the memory 200 of FIG. 2 to operate safely and effectively without incurring any undue data or operational errors.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims and the equivalents thereof.

What is claimed is:

1. A multiplexer circuit for use in a memory, comprising:
 a multiplexer circuit output;
 a first bit line circuit coupled to receive a first bit line of a memory and coupled to receive a select signal, the first bit line circuit having an output coupled to the multiplexer circuit output, the first bit line circuit selectively providing, based at least partially upon the first select signal, data from the first bit line to the multiplexer circuit output;

wherein the first bit line circuit comprises a first precharge control circuit, which receives a first input signal derived from a read enable signal, and generates therefrom a first precharge control signal, the first precharge control signal being timed such that it causes a first precharge circuit to stop precharging the first bit line before any word line of the memory is activated; and a second bit line circuit coupled to receive a second bit line of a memory and coupled to receive a complement of the select signal, the second bit line circuit having an output coupled to the multiplexer circuit output, the second bit line circuit selectively providing, based at least partially upon the complement of the select signal, data from the second bit line to the multiplexer circuit output;

wherein the second bit line circuit comprises a second precharge control circuit, which receives a second input signal derived from the read enable signal, and generates therefrom a second precharge control signal, the second precharge control signal being timed such that it causes a second precharge circuit to stop precharging the second bit line before any word line of the memory is activated; and wherein the first and second bit line circuits operate such that data from only one of the first and second bit lines is provided to the multiplexer circuit output at any given time.

2. The multiplexer circuit of claim 1, wherein the select signal is an undecoded bit from an address provided to the memory, and wherein the complement of the select signal is the complement of that undecoded bit.

3. The multiplexer circuit of claim 1, wherein the first bit line circuit further comprises the first precharge circuit for precharging the first bit line, and wherein the second bit line circuit further comprises the second precharge circuit for precharging the second bit line.

4. The multiplexer circuit of claim 1, wherein the first bit line circuit further comprises a first data sensing control circuit, which receives the select signal and one or more input signals derived from the read enable signal, and generates therefrom a first sensing control signal, which controls the operation of a first data sensing circuit which senses data on the first bit line, the first sensing control signal being timed relative to the first precharge control signal such that the first sensing control signal causes the first data sensing circuit to stop sensing data on the first bit line before the first precharge control signal causes the first precharge circuit to precharge the first bit line.

5. The multiplexer circuit of claim 4, wherein the second bit line circuit further comprises a second data sensing control circuit, which receives the complement of the select signal and one or more input signals derived from the read enable signal, and generates therefrom a second sensing control signal, which controls the operation of a second data sensing circuit which senses data on the second bit line, the second sensing control signal being timed relative to the second precharge control signal such that the second sensing control signal causes the second data sensing circuit to stop sensing data on the second bit line before the second precharge control signal causes the second precharge circuit to precharge the second bit line.

6. The multiplexer circuit of claim 5, wherein the first bit line circuit further comprises the first data sensing circuit for sensing data on the first bit line, and wherein the second bit line circuit further comprises the second data sensing circuit for sensing data on the second bit line.

7. The multiplexer circuit of claim 1, wherein the first bit line circuit comprises:

a first inverter having an input coupled to receive a first input signal derived from a read enable signal, and an output;

a second inverter having an input coupled to the output of the first inverter, and an output;

a first NAND gate having a first input coupled to receive the select signal and a second input coupled to the output of the second inverter, and an output; and a first NOR gate having a first input coupled to the output of the first inverter and a second input coupled to the output of the first NAND gate, and an output;

wherein the output of the second inverter is used as a first precharge control signal for controlling the operation of a first precharge circuit which precharges the first bit line; and wherein the output of the first NOR gate is used as a first sensing control signal for controlling the operation of a first data sensing circuit which senses data on the first bit line.

8. The multiplexer circuit of claim 7, wherein the second bit line circuit comprises:

a third inverter having an input coupled to receive a second input signal derived from the read enable signal, and an output;

a fourth inverter having an input coupled to the output of the third inverter, and an output;

a second NAND gate having a first input coupled to receive the complement of the select signal and a second input coupled to the output of the fourth inverter, and an output; and a second NOR gate having a first input coupled to the output of the third inverter and a second input coupled to the output of the second NAND gate, and an output;

wherein the output of the fourth inverter is used as a second precharge control signal for controlling the operation of a second precharge circuit which precharges the second bit line; and wherein the output of the second NOR gate is used as a second sensing control signal for controlling the operation of a second data sensing circuit which senses data on the second bit line.

9. The multiplexer circuit of claim 8, wherein the output of the first NOR gate transitions from a logic 0 to a logic 1 with a relatively long delay but transitions from a logic 1 to a logic 0 relatively quickly, and wherein the output of the second NOR gate transitions from a logic 0 to a logic 1 with a relatively long delay but transitions from a logic 1 to a logic 0 relatively quickly.

10. A memory, comprising:

a word line;

a plurality of bit lines;

a cell region comprising a plurality of memory cells, each of the memory cells in the cell region having a control input coupled to the word line such that when the word line is activated, all of the memory cells in the cell region are activated, each of the memory cells in the cell region also having a data terminal coupled to a corresponding one of the plurality of bit lines such that each memory cell in the cell region is coupled to a different one of the plurality of bit lines; and a multiplexer circuit having a set of inputs coupled to the plurality of bit lines, one or more select inputs coupled to receive one or more select signals, and an output, the multiplexer circuit selectively providing, based at least partially upon the one or more select signals, data from one of the plurality of bit lines on the output;

wherein the multiplexer circuit comprises:
 a first bit line circuit coupled to receive a first bit line in the plurality of bit lines and a select signal, the first bit line circuit having an output coupled to the output of the multiplexer circuit, the first bit line circuit selectively providing, based at least partially upon the first select signal, data from the first bit line to the output of the multiplexer circuit;
 wherein the first bit line circuit comprises a precharge control circuit, which receives a first input signal derived from a read enable signal, and generates therefrom a precharge control signal, the precharge control signal being timed such that it causes a precharge circuit to stop precharging the first bit line before the word line is activated; and
 a second bit line circuit coupled to receive a second bit line in the plurality of bit lines and a complement of the select signal, the second bit line circuit having an output coupled to the output of the multiplexer circuit, the second bit line circuit selectively providing, based at least partially upon the complement of the first select signal, data from the second bit line to the output of the multiplexer circuit;
 wherein the second bit line circuit comprises a second precharge control circuit, which receives a second input signal derived from the read enable signal, and generates therefrom a second precharge control signal, the second precharge control signal being timed such that it causes a second precharge circuit to stop precharging the second bit line before any word line of the memory is activated.

11. The memory of claim 10, wherein the plurality of memory cells in the cell region fit inside a single pitch.

12. The memory of claim 11, wherein the pitch is approximately 5.2 micrometers in size.

13. The memory of claim 10, further comprising:
a decoder coupled to receive a subset of a set of address lines, the subset of address lines comprising some but not all of the address lines in the set of address lines, the decoder activating the word line when a proper set of address signals is received on the subset of address lines.

14. The memory of claim 13, wherein the set of address lines comprises one or more remainder address lines which are not part of the subset of address lines, and wherein the one or more remainder address lines are coupled to the one or more select inputs of the multiplexer circuit to provide the one or more select signals.

15. The memory of claim 10, wherein the memory comprises a latch cell, and wherein the output of the multiplexer circuit is coupled to the latch cell.

16. The memory of claim 10, wherein the first and second bit line circuits operate such that data from only one of the first and second bit lines is provided to the output of the multiplexer circuit at any given time.

17. The memory of claim 16, wherein the select signal is an undecoded from an address provided to the memory, and wherein the complement of the select signal is the complement of that undecoded bit.

18. The memory of claim 10, wherein the first bit line circuit further comprises the precharge circuit for precharging the first bit line.

19. The memory of claim 10, wherein the first bit line circuit further comprises a data sensing control circuit, which receives the select signal and one or more input signals derived from the read enable signal, and generates therefrom a sensing control signal, which controls the operation of a data sensing circuit which senses data on the first bit line, the sensing control signal being timed relative to the precharge control signal such that the sensing control signal causes the data sensing circuit to stop sensing data on the first bit line before the precharge control signal causes the precharge circuit to precharge the first bit line.

20. The memory of claim 19, wherein the first bit line circuit further comprises the data sensing circuit for sensing data on the first bit line.

21. The memory of claim 10, wherein the first bit line circuit comprises:
 a first inverter having an input coupled to receive an input signal derived from a read enable signal, and an output;
 a second inverter having an input coupled to the output of the first inverter, and an output;
 a NAND gate having a first input coupled to receive the select signal and a second input coupled to the output of the second inverter, and an output; and
 a NOR gate having a first input coupled to the output of the first inverter and a second input coupled to the output of the NAND gate, and an output;
 wherein the output of the second inverter is used as a precharge control signal for controlling the operation of a precharge circuit which precharges the first bit line; and
 wherein the output of the NOR gate is used as a sensing control signal for controlling the operation of a data sensing circuit which senses data on the first bit line.

22. The memory of claim 21, wherein the output of the NOR gate transitions from a logic 0 to a logic 1 with a relatively long delay but transitions from a logic 1 to a logic 0 relatively quickly.

23. A memory, comprising:
 a word line;
 a first plurality of single-ended bit lines;
 a second plurality of single-ended bit lines;
 a first cell region comprising a plurality of memory cells, each of the memory cells in the first cell region having a control input coupled to the word line such that when the word line is activated, all of the memory cells in the first cell region are activated, each of the memory cells in the first cell region also having a data terminal coupled to a corresponding single-ended bit line in the first plurality of single-ended bit lines such that each memory cell in the first cell region is coupled to a different single-ended bit line in the first plurality of single-ended bit lines;
 a second cell region comprising a plurality of memory cells, each of the memory cells in the second cell region having a control input coupled to the word line such that when the word line is activated, all of the memory cells in the second cell region are activated, each of the memory cells in the second cell region also having a data terminal coupled to a corresponding single-ended bit line in the second plurality of single-ended bit lines such that each memory cell in the second cell region is coupled to a different single-ended bit line in the second plurality of single-ended bit lines;
 a first multiplexer circuit having a set of inputs coupled to the first plurality of single-ended bit lines, one or more select inputs coupled to receive one or more select signals, and a first output, the first multiplexer circuit selectively providing, based at least partially upon the one or more select signals, data from one of the single-ended bit lines in the first plurality of single-ended bit lines on the first output; and a second multiplexer circuit having a set of inputs coupled to the second plurality of single-ended bit lines, one or more select inputs coupled to receive the one or more select signals, and a second output, the second multiplexer circuit selectively providing, based at least partially upon the one or more select signals, data from one of the single-ended bit lines in the second plurality of single-ended bit lines on the second output.

* * * * *